United States Patent
Molin et al.

(10) Patent No.: US 11,742,396 B2
(45) Date of Patent: *Aug. 29, 2023

(54) THRESHOLD VOLTAGE ADJUSTMENT USING ADAPTIVELY BIASED SHIELD PLATE

(71) Applicant: Silanna Asia Pte Ltd, Singapore (SG)

(72) Inventors: Stuart B. Molin, Carlsbad, CA (US); George Imthurn, San Diego, CA (US); James Douglas Ballard, Solana Beach, CA (US); Yashodhan Vijay Moghe, Sydney (AU)

(73) Assignee: Silanna Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/453,928

(22) Filed: Nov. 8, 2021

(65) Prior Publication Data
US 2022/0059663 A1 Feb. 24, 2022

Related U.S. Application Data

(63) Continuation of application No. 16/859,154, filed on Apr. 27, 2020, now Pat. No. 11,171,215, which is a (Continued)

(51) Int. Cl.
*H01L 29/40* (2006.01)
*H01L 29/66* (2006.01)
(Continued)

(52) U.S. Cl.
CPC ........ *H01L 29/402* (2013.01); *G01R 19/0092* (2013.01); *H01L 29/404* (2013.01);
(Continued)

(58) Field of Classification Search
CPC ... H01L 29/402; H01L 29/404; H01L 29/407; H01L 29/66613; H01L 29/66674;
(Continued)

(56) References Cited

U.S. PATENT DOCUMENTS 5,374,843 A 12/1994 Williams et al.
5,898,198 A 4/1999 Herbert et al.
(Continued)

FOREIGN PATENT DOCUMENTS

WO 2011054280 A1 5/2011

OTHER PUBLICATIONS

ABB, Applying IGCTs, Application Note 5SYA 2032-03, Available at http://www05.abb.com/global/scot/scot256.nsf/veritydisplay/51154b233cdcc83883257cd3002af728/$file/Applying%20IGCTs_5SYA%202032-03.pdf, Accessed on Dec. 10, 2014.
(Continued)

*Primary Examiner* — Eduardo A Rodela
(74) *Attorney, Agent, or Firm* — MLO, a professional corp.

(57) ABSTRACT

An apparatus includes a first lateral diffusion field effect transistor (LDFET) having a first threshold voltage and that includes a first gate electrode, a first drain contact, a first source contact, and a first electrically conductive shield plate separated from the first gate electrode and the first source contact by a first interlayer dielectric. A second LDFET of the apparatus has a second threshold voltage and includes a second gate electrode, a second drain contact, and a second source contact. The second source contact is electrically connected to the first source contact of the first LDFET. A control circuit of the apparatus is electrically coupled to the first electrically conductive shield plate and is configured to apply to the first electrically conductive shield plate a first gate bias voltage of a first level to set the first threshold voltage of the first LDFET to a first desired threshold voltage.

8 Claims, 10 Drawing Sheets

Related U.S. Application Data continuation-in-part of application No. 16/234,864, filed on Dec. 28, 2018, now Pat. No. 10,636,905, which is a continuation of application No. 15/407,174, filed on Jan. 16, 2017, now Pat. No. 10,192,983, which is a continuation of application No. 14/574,707, filed on Dec. 18, 2014, now Pat. No. 9,559,199.

(51) Int. Cl.
*H01L 29/78* (2006.01)
*G01R 19/00* (2006.01)

(52) U.S. Cl.
CPC ...... *H01L 29/407* (2013.01); *H01L 29/66613* (2013.01); *H01L 29/66674* (2013.01); *H01L 29/66681* (2013.01); *H01L 29/7816* (2013.01); *H01L 29/7817* (2013.01); *H01L 29/7823* (2013.01); *H01L 29/7824* (2013.01); *H01L 29/7826* (2013.01); *H01L 29/7835* (2013.01)

(58) Field of Classification Search
CPC ........... H01L 29/66681; H01L 29/7816; H01L 29/7817; H01L 29/7823; H01L 29/7824; H01L 29/7826; H01L 29/7835; H01L 29/41775; H01L 29/42372; H01L 29/42376

See application file for complete search history.

(56) References Cited

U.S. PATENT DOCUMENTS

| | | | |
|---|---|---|---|
| 5,907,173 | A | 5/1999 | Kwon et al. |
| 5,912,490 | A | 6/1999 | Hebert et al. |
| 6,222,229 | B1 | 4/2001 | Hebert et al. |
| 6,465,845 | B1 | 10/2002 | Baek |
| 7,049,669 | B2 | 5/2006 | Ma et al. |
| 7,262,476 | B2 | 8/2007 | Bude et al. |
| 7,282,765 | B2 | 10/2007 | Xu et al. |
| 7,365,402 | B2 | 4/2008 | Ma |
| 7,683,426 | B2 | 3/2010 | Williams et al. |
| 7,986,186 | B2 | 7/2011 | Marbell et al. |
| 8,008,977 | B2 | 8/2011 | Tserng et al. |
| 8,063,446 | B2 | 11/2011 | Ko |
| 8,212,315 | B2 | 7/2012 | Lotfi et al. |
| 8,264,039 | B2 | 9/2012 | Wang et al. |
| 8,450,802 | B2 | 5/2013 | De et al. |
| 8,604,513 | B2 | 12/2013 | Ashida et al. |
| 8,680,615 | B2 | 3/2014 | Mitra et al. |
| 8,748,271 | B2 | 6/2014 | Toh et al. |
| 9,633,994 | B2 | 4/2017 | Babcock et al. |
| 9,633,995 | B2 | 4/2017 | Babcock et al. |
| 11,171,215 | B2 * | 11/2021 | Molin .................. H01L 29/407 |
| 2002/0109184 | A1 | 8/2002 | Hower et al. |
| 2004/0201078 | A1 | 10/2004 | Ren |
| 2005/0280087 | A1 | 12/2005 | Babcock et al. |
| 2006/0113625 | A1 | 6/2006 | Bude et al. |
| 2010/0085120 | A1 | 4/2010 | Marbell et al. |
| 2010/0277142 | A1 | 11/2010 | Tan et al. |
| 2011/0073946 | A1 | 3/2011 | Theeuwen et al. |
| 2012/0168817 | A1 | 7/2012 | Abou-Khalil et al. |
| 2012/0228705 | A1 | 9/2012 | Toh |
| 2013/0146973 | A1 | 6/2013 | Mitra et al. |
| 2014/0103968 | A1 | 4/2014 | Heringa et al. |
| 2014/0117446 | A1 | 5/2014 | Ren et al. |
| 2015/0200198 | A1 | 7/2015 | Chen et al. |
| 2015/0340448 | A1 | 11/2015 | Babcock et al. |
| 2016/0056114 | A1 | 2/2016 | Gao et al. |
| 2016/0181420 | A1 | 6/2016 | Imthurn et al. |

OTHER PUBLICATIONS

Abou-Khalil, et al., Lateral Tapered Active Field-Plate LDMOS Device for 20V Application in Thin-Film SOI, Proceedings of the 25th Int. Symp. on Power Semiconductor Devices & ICs, Kanazawa, JP, May 2013.

Brech, et al., Voltage Optimization for State of the Art RF-LDMOS for 2.1 GHz W-CDMA Cellular Infrastructure Applications, RF & DSP Infrastructure Division, Semiconductor Products Sector, Motorola, IEEE, Jun. 2003.

Fujishima, et al., A 700V Lateral Power MOSFET with Narrow Gap Double Metal Field Plates Realizing Low On-resistance and Long-term Stability of Performance, Proceedings of the 2001 Int. Symp. on Power Semiconductor Devices & ICs, Osaka, JP, Jun. 2001.

International Rectifier, Using Standard Control ICs to Generate Negative Gate Bias for MOSFETs and IGBTs, Technical Document DT92-3, Available at: http://www.irf.com/technical-info/designtp/dt92-3.pdf, Accessed on Dec. 10, 2014.

International Search Report and Written Opinion dated Feb. 16, 2016 for PCT Patent Application PCT/IB2015/059637.

Marbell, et al.. Adaptive LDMOSFET Drain and Dummy-Gate Biases for Highly Modulated Signals, IEEE Transactions on Electron Devices, vol. 55, No. 12, pp. 3555-3561, Dec. 2008.

Marbell, et al., Effects of Dummy Gate on Breakdown and Degradation of LDMOSFETs, IEEE Transactions on Device and Materials Reliability, vol. 8, No. 1, pp. 193-202, Mar. 2008.

Marbell, et al., Modeling and Characterizzation of Effects of Dummy-Gate Bias on LDMOSFETs, IEEE Transactions on Electron Devices, vol. 54, No. 3, pp. 580-588, Mar. 2007.

Notice of Allowance and Fees dated Jul. 15, 2021 for U.S. Appl. No. 16/859,154.

Notice of Allowance dated Jan. 9, 2020 for U.S. Appl. No. 16/234,864.

Notice of Allowance dated Sep. 26, 2016 for U.S. Appl. No. 14/574,707.

Notice of Allowance dated Sep. 28, 2018 for U.S. Appl. No. 15/407,174.

Office Action dated Jul. 23, 2019 for U.S. Appl. No. 16/234,864.
Office Action dated Mar. 31, 2021 for U.S. Appl. No. 16/859,154.
Office Action dated May 16, 2016 for U.S. Appl. No. 14/574,707.
Office Action dated May 16, 2018 for U.S. Appl. No. 15/407,174.
Office Action dated Oct. 7, 2019 for U.S. Appl. No. 16/234,864.

* cited by examiner

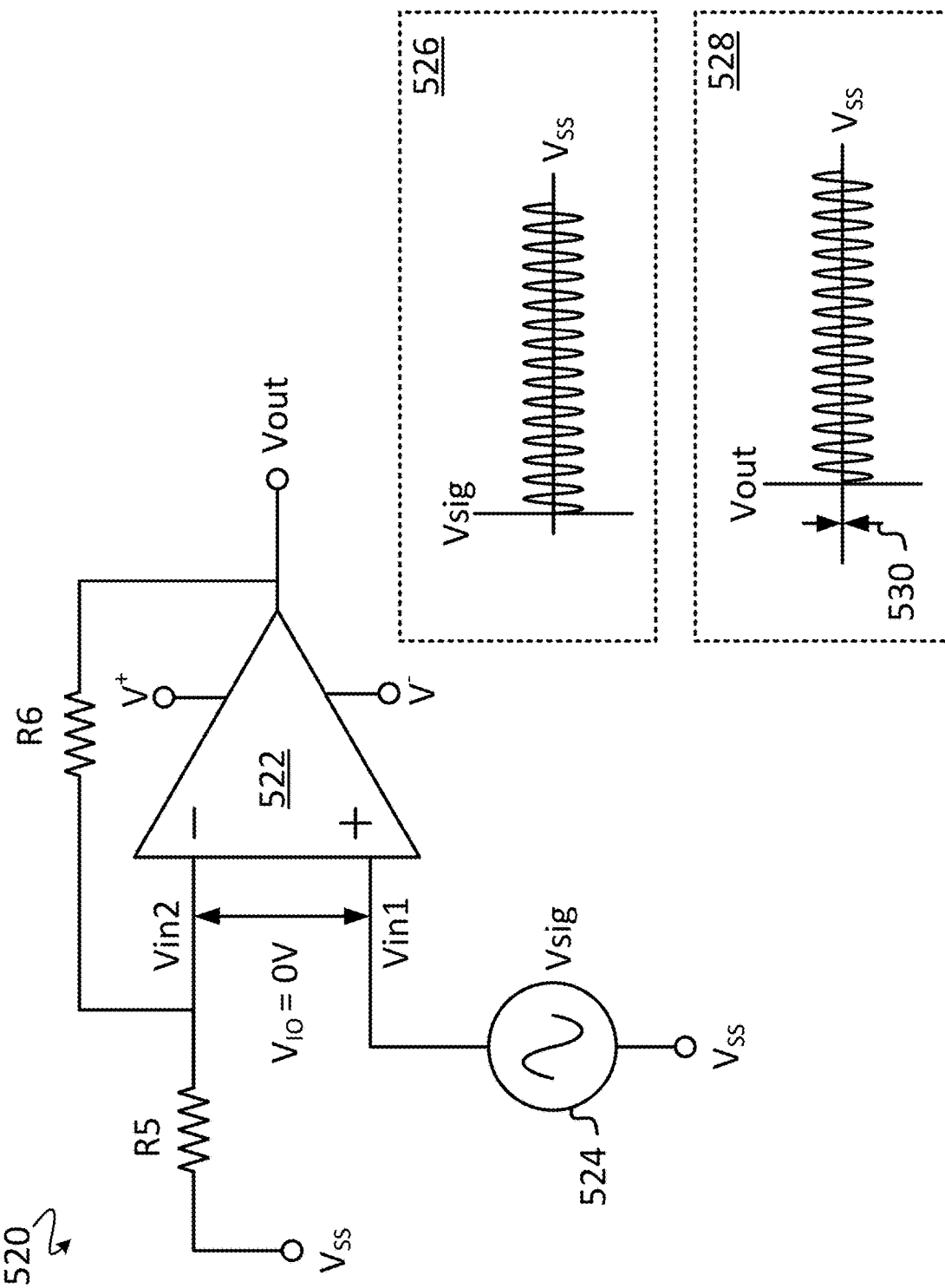

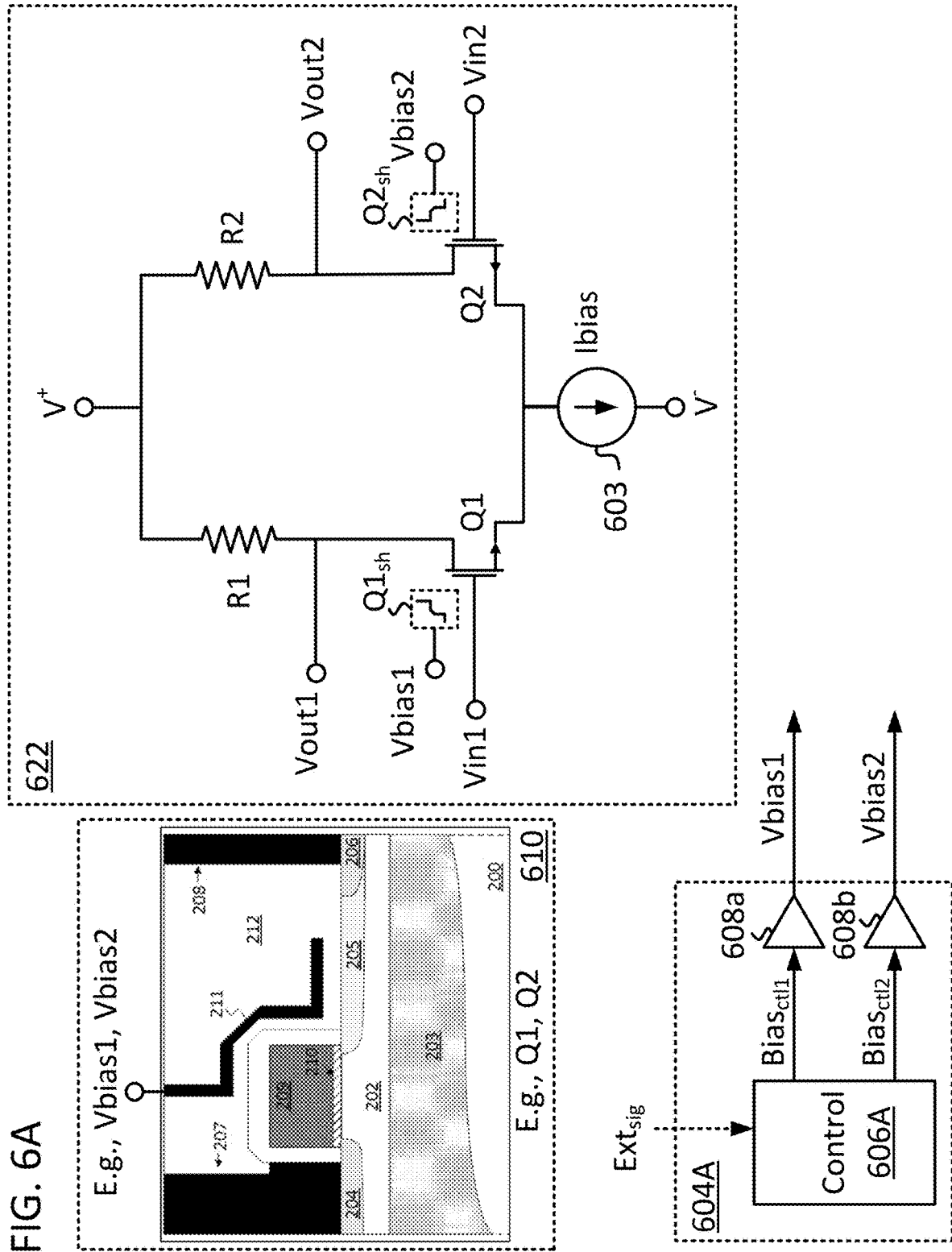

THRESHOLD VOLTAGE ADJUSTMENT USING ADAPTIVELY BIASED SHIELD PLATE

CROSS-REFERENCE TO RELATED APPLICATIONS

This application is a continuation of U.S. patent application Ser. No. 16/859,154, filed Apr. 27, 2020, which is a continuation-in-part of U.S. Pat. No. 10,636,905, issued Apr. 28, 2020, which is a continuation of U.S. Pat. No. 10,192,983, issued Jan. 29, 2019, which is a continuation of U.S. Pat. No. 9,559,199, issued Jan. 31, 2017, all of which are incorporated by reference herein in their entirety for all purposes.

BACKGROUND OF THE INVENTION

Semiconductor power devices have been in use since the early 1950s. They are specialized devices used as switches or rectifiers in power electronics circuits. Semiconductor power devices are characterized by their ability to withstand high voltages and large currents as well as the high temperatures associated with high power operation. For example, a switching voltage regulator will comprise two power devices that constantly switch on and off in a synchronized manner to regulate a voltage. The power devices in this situation need to sink system-level current in the on state, withstand the full potential of the power supply in the off state, and dissipate a large amount of heat. The ideal power device is able to operate in high power conditions, can rapidly switch between on and off states, and exhibits low thermal and on-state resistance.

A transistor structure referred to as a lateral diffusion field effect transistor (LDFET) can be used to implement a power device. The "lateral diffusion" portion of this term refers to an extension of the drain region that is less strongly doped than the core drain region and that extends laterally away from the channel. This region is often referred to as the low-doped or lightly-doped drain (LDD) region. The LDD region allows the transistor to switch high voltages by making it able to withstand greater voltages in the off-state by absorbing portions of the electric field that would otherwise cause source-drain punch through, and to handle larger currents in the on-state by preventing a large potential drop from building up at the drain-body interface which would otherwise result in degradation of the device via the injection of hot carriers into the body of the device.

LDFET transistors can include a shield plate that covers at least a portion of the LDD region and the gate electrode. The shield plate blocks the LDD region and the gate from large current and voltage signals that are applied to the drain contact of the device. As such, the shield plate lowers the gate-to-drain capacitance of the LDFET structure. In addition, the shield plate allows for a higher doping of the LDD because the LDD is less affected by large voltage signals applied to the drain contact of the device. As a result, the on-state resistance of the power device can decrease while preserving the device's breakdown and punch-through resistance.

A differential-pair amplifier ("differential amplifier") may include two or more transistors, such as LDFETs, or other transistors. A differential amplifier is a type of electric amplifier that amplifies a voltage difference between two input voltages received at respective inputs of the differential amplifier. However, due to non-idealities of the two or more transistors of the differential amplifier, an input offset voltage $V_{IO}$ between the inputs of the differential amplifier may introduce a voltage error at an output of the differential amplifier.

FIG. 1 displays cross section 100 of a conventional LDFET. The transistor comprises an active region 101 of a semiconductor wafer with an LDD 102 formed therein along with a drain region 103 and source region 104. A channel is formed between LDD 102 and source region 104 under the influence of a voltage applied to gate electrode 105. Gate electrode 105 is separated from the active region by a gate insulator 106. Shield plate 107 is coupled to source contact 108 and shields the gate electrode 105 and LDD 102 from drain contact 109. The source contact 108 of the power device is connected to ground. The shield plate is therefore also biased at ground to provide an adequate shield for LDD 102 and gate electrode 105 without disturbing the carriers in LDD 102. The shield plate is isolated from LDD 102 by an interlayer dielectric 110. The interlayer dielectric also provides a surface for additional circuitry such as integrated wiring between portions of the same integrated circuit.

SUMMARY OF INVENTION

In some embodiments, an apparatus includes a first lateral diffusion field effect transistor (LDFET) having a first threshold voltage and that includes a first gate electrode, a first drain contact, a first source contact, and a first electrically conductive shield plate separated from the first gate electrode and the first source contact by a first interlayer dielectric. A second LDFET of the apparatus has a second threshold voltage and includes a second gate electrode, a second drain contact, and a second source contact. The second source contact is electrically connected to the first source contact of the first LDFET. A control circuit of the apparatus is electrically coupled to the first electrically conductive shield plate and configured to apply to the first electrically conductive shield plate a first gate bias voltage of a first level to set the first threshold voltage of the first LDFET to a first desired threshold voltage.

In some embodiments, a differential amplifier includes a first input voltage terminal, a second input voltage terminal, a voltage output terminal, and a first differential pair. The first differential pair includes a first lateral diffusion field effect transistor (LDFET) and a second LDFET. The first LDFET includes a first drain contact, a first source contact, a first gate electrode that is electrically coupled to the first input voltage terminal, and a first electrically conductive shield plate separated from the first gate electrode and the first source contact by a first interlayer dielectric. The second LDFET includes a second drain contact, a second source contact and a second gate electrode that is electrically coupled to the second input voltage terminal. A control circuit is electrically coupled to the first electrically conductive shield plate and is configured to apply to the first electrically conductive shield plate a first gate bias voltage of a first level to set an input offset voltage of the differential amplifier to a desired voltage level.

BRIEF DESCRIPTION OF THE DRAWINGS

FIG. 5B illustrates a simplified schematic of a circuit and signals related to operation thereof using a differential amplifier, in accordance with some embodiments.

FIG. 6A illustrates a simplified schematic of a first differential amplifier having an adjustable input offset voltage $V_{IO}$ using adaptively biased shield plates, in accordance with some embodiments.

DETAILED DESCRIPTION OF THE EMBODIMENTS

Figure 1:
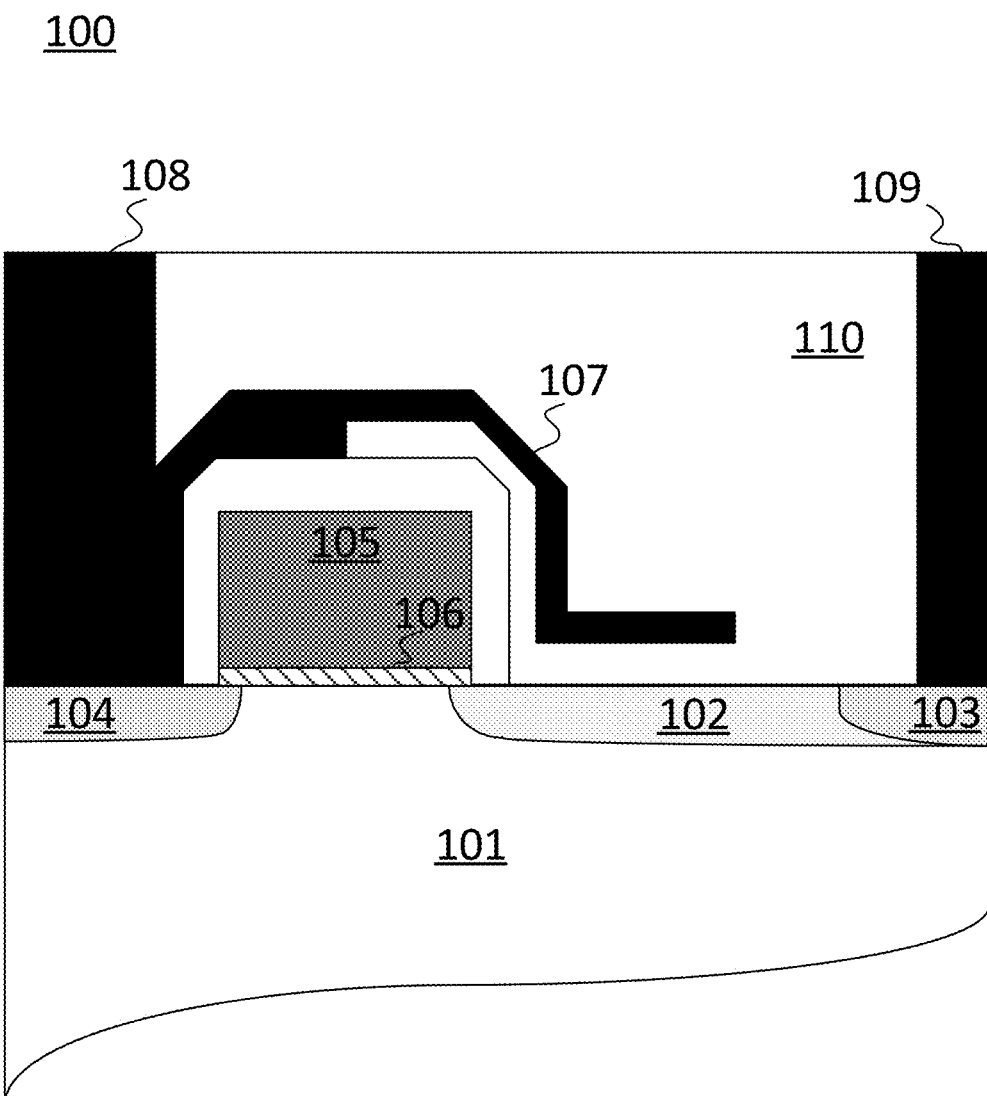
FIG. 1 illustrates a cross section of a lateral diffusion transistor that is in accordance with the related art.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

The lightly doped drain (LDD) region of a lateral diffusion field effect transistor (LDFET) provides the device with an increased breakdown voltage at the expense of increasing the on-resistance of the transistor. Increasing the breakdown voltage of the transistor can be achieved by decreasing the doping level of the LDD or by extending the lateral expanse of the LDD both of which also increase the on-resistance of the device. However, both of these alterations cause a commensurate increase in the on-resistance of the transistor because the impedance of a region of material is directly proportional to the length of the region in the direction of current flow, and because the conductivity of a region of semiconductor material for a particular carrier type is directly proportional to the dopant concentration of a matching conductivity type dopant. This interrelationship presents a difficult design problem because the on-state resistance of a power device must be kept low or the device will burn a significant amount of power when it sinks the large currents that power devices are meant to handle.

The direct trade-off between breakdown voltage and on-resistance can be severed by separately biasing the shield plate of an LDFET transistor with an adaptive voltage that changes based on the state of the device. This approach can be applied to any similar device that includes a lower conductivity region for enhancing breakdown voltages that is shielded from a device contact. For purposes of this disclosure, the LDFET will be applied to describe this family of similar devices. In particular, LDFETs are not limited to devices having metal gate electrodes and oxide gate insulators. The adaptively biased shield plate of an LDFET can still decrease gate to drain capacitance, but it can further serve to decrease the on-resistance of the device while at the same time increasing the breakdown voltage of the device, as well as adjust a threshold voltage $V_{th}$ of the LDFET. A threshold voltage $V_{th}$ of the LDFET is a minimum gate-to-source voltage of the LDFET that is needed to create a conducting path between the source and drain terminals of the LDFET. Instead of being coupled to the source, the shield plate can be connected to a separate control circuit. In some situations, this control circuit is capable of providing a voltage to the shield plate that is less than ground, greater than the supply voltage of the integrated circuit to which it is a part, or is another voltage that is greater than ground and less than the supply voltage. This bias voltage serves to prevent a build-up of majority carriers in the LDD and thereby combats the effect of a large voltage applied to the drain contact of the device.

A transistor having a shield plate that is configured to receive a bias voltage to adjust a threshold voltage $V_{th}$ of that transistor, as disclosed herein, can be advantageously used to form a differential pair (e.g., of a differential-pair amplifier) having an input offset voltage $V_{IO}$ that can be set to a desired input offset voltage (e.g., zero, almost zero, or another desired voltage). Embodiments of such differential-pair amplifiers, as disclosed herein, advantageously amplify an input signal with higher fidelity than conventional differential-pair amplifiers.

Figure 2:
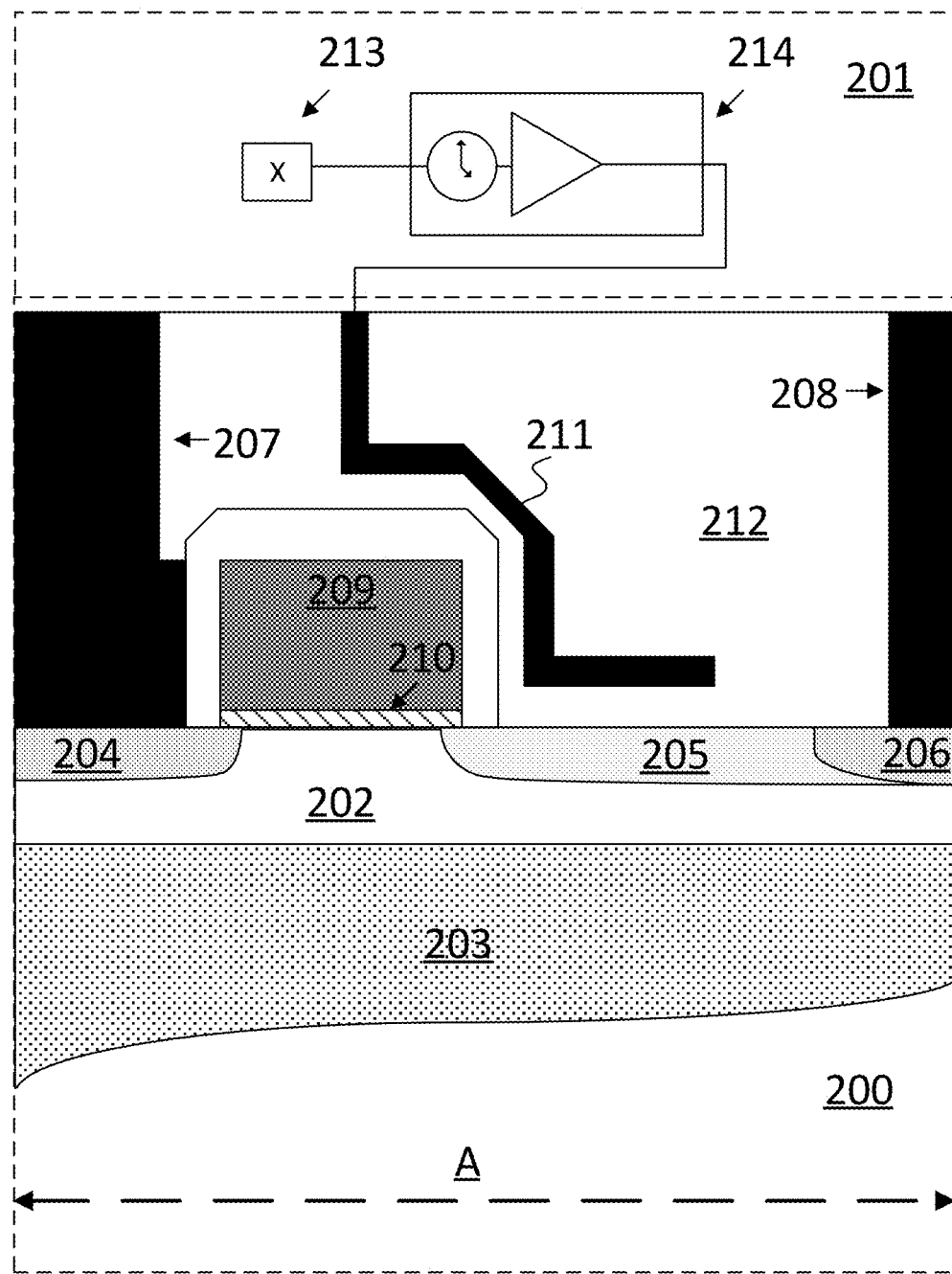
FIG. 2 illustrates a cross section of a lateral diffusion transistor and an accompanying circuit schematic that are in accordance with embodiments of the present invention.

FIG. 2 illustrates a semiconductor cross section 200 and an associated circuit schematic of a control circuit 201 that illustrate an approach for improving the on-resistance and voltage hold off of a device over that of an LDFET in which the shield plate is coupled to the source. Cross section 200 includes an LDFET with an active region 202. The active region 202 can be a doped portion of the bulk of a semiconductor wafer, a localized well formed in a larger doped portion of a semiconductor wafer, the active region of a semiconductor-on-insulator (SOI) wafer, or a localized well formed in an SOI wafer. As illustrated, active region 202 is a thin film formed over the buried insulator 203 of an SOI wafer.

Active region 202 includes source region 204, lightly doped drain (LDD) region 205, and drain region 206. All three regions can comprise doped semiconductor material formed by, for example, the implant of impurities into active region 202. The doped semiconductor material of each region has a similar conductivity type. Therefore, each region can be formed by the same dopant species such as through the implant of one kind of dopant atom. LDD region 205 has a lower dopant concentration than drain region 206 and may also have a lower dopant concentration than source region 204. The LDD region 205 is what provides the LDFET with its superior performance as a power device in terms of its ability to hold off large voltages and not degrade while sinking large currents. The presence of LDD region 205 provides the LDFET with its characteristic of having asymmetric source and drain regions. In some approaches, LDD region 205 generally extends at least twice as far from the channel as the source region extends from the channel. Source region 204 is electrically coupled to source contact 207. Drain region 206 is electrically coupled to drain contact 208. Drain region 206 can be a highly doped drain region and can form an electrically conductive path between drain contact 208 and LDD region 205.

Source contact 207 and drain contact 208 provide electrical connections to the LDFET from other circuitry which may or may not be integrated with the LDFET on the same integrated circuit. Source region 204 can be electrically coupled to source contact 207 via a silicide layer formed on the surface of source region 204. More generally, source region 204 can be coupled to source contact 207 using any process that forms an ohmic or non-rectifying contact between the two regions of the structure. The connection between drain contact 208 and drain region 206 can comprise any of the variations described above with reference to source contact 207 and source region 204. Source contact 207 and drain contact 208 can comprise a metal, metal alloy, metal silicide, or an electrically conductive semiconductor material such as doped polysilicon. Exemplary metals, metal alloys, and metal silicides can each comprise copper, tungsten, molybdenum, and aluminum.

The LDFET in cross section 200 operates as a switch by presenting a variably electrically conductive path from drain contact 208 to source contact 207 through a channel that separates source region 204 and LDD region 205. The channel has an opposite conductivity type to source region 204 and LDD region 205 and separates those two regions from each other. The variability in the conductivity of the electrical path is influenced by a control voltage applied to gate electrode 209 which is separated from the channel by gate dielectric 210. A voltage applied to the gate electrode controls a flow of current in the channel by changing a concentration of free carriers in the channel which thereby creates a localized change in the conductivity type of the channel. From a first order perspective, the LDFET will conduct current when the conductivity type of the localized region matches that of LDD region 205 and source region 204, and will not conduct current when the conductivity type of the localized region is the opposite of that of LDD region 205 and source region 204.

Shield plate 211 is located above gate electrode 209 and LDD region 205. The shield plate can be isolated and separated from the LDD region of the LDFET using an interlayer dielectric that is etched prior to the formation of the shield plate. The same interlayer dielectric can then be formed over the shield plate to isolate it from additional circuitry. As illustrated, shield plate 211 is separated from LDD region 205, gate electrode 209, and source contact 207 by interlayer dielectric 212.

Shield plate 211 is not connected to source contact 207 and is instead electrically isolated from the source. In specific approaches, the shield plate of an LDFET device is biased by an externally applied voltage. The externally applied voltage can be lower than the voltage applied to the source. These approaches include those in which the source is biased at a ground voltage such that the externally applied voltage is negative. In addition, although cross section 200 has been discussed with reference to an n-channel LDFET in which source region 204 and LDD region 205 have an n-type conductivity, the approaches discussed herein apply to LDFETs of either conductivity type by switching the polarity of the discussed control signals. In this particular instance, for a p-channel LDFET, the shield plate 211 could be biased at a voltage in excess of the bias applied to the source region. These approaches include those in which the source is biased at the supply voltage such that the externally applied voltage exceeds the supply voltage.

The shield plate can be biased via a contact that is formed in various ways. The processing steps used to form the contact can be similar to those used to form source contact 207 and drain contact 208. As illustrated, the contact to shield plate 211 is drawn as a vertical contact down through interlayer dielectric 212. However, the contact to shield plate 211 does not need to be in the same plane as the channel of the device. Indeed, parasitic capacitance can be decreased in situations where the contact is outside a lateral extent of the LDFET. For example, the shield plate could extend out of the plane of the page to a portion that extends beyond the edge of active region 202, and contact to the shield plate could be formed above that portion of the shield plate. Multiple contacts could also be made to shield plate 211 through interlayer dielectric 212 to decrease the impedance of the conductive paths by which each portion of shield plate 211 were biased.

The externally applied voltage can be provided by circuitry that is integrated on the same integrated circuit as the LDFET or from an external circuit. For example, a charge pump or generic negative voltage generator can be integrated with the LDFET and used to generate the applied voltage. As another example, a digital-to-analog converter (DAC) can be integrated with the LDFET, or be implemented in a circuit external to the LDFET, to generate the applied voltage. As yet another example, a control circuit can be formed using standard transistors that are co-integrated with the LDFET. These standard transistors could be complementary metal oxide semiconductor FETs integrated with the LDFET. An associated control circuit, such as control circuit 201, could be integrated on a monolithic substrate with the LDFET and could comprise a set of standard complementary FETs. Control circuit 201 could also be part of the same integrated circuit as the cross section 200, but be formed on a separate wafer to form a multi-substrate or 3D integrated circuit. Likewise, control circuit 201 could be part of the same package as the cross section 200, but be located on a separate die in a multi-die package or 3D package. In some embodiments, control circuit 201 includes one or more DACs. Although control circuit 201 is illustrated as being formed above cross section 200, this is for illustrative purposes only. The control circuit 201 could be formed above cross section 200 on the same monolithic substrate, or it could be formed on another laterally spaced apart portion of the substrate and be connected to the LDFET by a metallization layer above and extending laterally between those two portions of the substrate.

Control circuit 201 can be set to apply a variable voltage to shield plate 211. The variable voltage can pull majority carriers in LDD region 205 towards shield plate 211 before the transistor is switched on and can push majority carriers in LDD region 205 away from shield plate 211 before the transistor is switched off. The variable voltage can be different based on the state of the switch. For example, the voltage could vary between different values when the switch was in the on-state, and the channel was providing a conductive path between source contact 207 and drain contact 208, and when the switch was in the off-state, and the channel was not providing a conductive path between source contact 207 and drain contact 208.

Providing a variable voltage to shield plate 211 serves to decouple the negative effect of LDD region 205 as to the on-state resistance of the LDFET and the positive effect of LDD region 205 as to the breakdown voltage of the LDFET, as well as adjusting a threshold voltage $V_{th}$ of the LDFET, by making the effective dopant concentration of LDD region 205 variable for a given device. As majority carriers are pulled toward shield plate 211 in the on-state, the conductivity of LDD region 205 will increase and the overall conductive path between drain contact 208 and source contact 207 will have lower impedance. As breakdown voltages are relatively not a concern in the on-state, the effective alteration of the dopant concentration towards a higher concentration will not have a deleterious effect on the device. Likewise, as majority carriers are pushed away from shield plate 211 in the on-state, the conductivity of LDD region 205 will decrease and the ability of LDD region 205 to prevent hot carrier injection into active region 202 and generally strengthen the LDFET against the application of high voltages will increase. As the conductivity of LDD region 205 is generally not a concern in the off-state, the effective alteration of the dopant concentration towards a lower concentration will not have a deleterious effect on the device.

The control circuit can vary the voltage applied to the shield plate using various approaches to provide the LDFET performance benefits described above. As illustrated, control circuit 201 includes a control pin 213 and a delay buffer circuit 214. The signal applied to control pin 213 could match a control signal that would ultimately control gate electrode 209. In these approaches, the delay of the delay buffer could be zero and the control signal would be delayed before being delivered to the gate electrode 209. In other approaches, control pin 213 may be connected to a sense circuit that measures the amount of current that the LDFET is currently sinking, or will be sinking in the near future, and could linearly adjust the voltage applied to shield plate 211 based on the measured current. In situations in which control circuit 201 and the cross section 200 are implemented on the same monolithic substrate, the control pin 213 can provide a connection to circuitry that is external to the integrated circuit or it can provide a connection to other internal circuitry on the same monolithic substrate as control circuit 201.

Control circuit 201 can ramp the variable voltage between a ground voltage and a supply voltage including ramping the voltage from a negative voltage that is below ground, or from a voltage that is greater than the supply voltage. The ramping of the applied voltage can be conducted based on the voltage applied to the gate of the LDFET. As mentioned above, the ramp would generally ramp from a negative voltage for the off state of an n-type LDFET and from a voltage greater than the supply voltage for the off state of a p-type LDFET. In particular, the control circuit 201 can ramp the voltage applied to shield plate 211 in synchronization with the control signal applied to gate electrode 209.

As mentioned above, control pin 213 could receive a signal based on the same control signals used to apply a voltage to gate electrode 209. However, in certain approaches control circuit 201 will begin ramping the voltage applied to the shield plate before the LDFET is switched on and complete ramping after the LDFET is switched on. In these situations, the signal applied to control pin 213 may need to anticipate the voltage applied to gate electrode 209 such that the voltage applied to shield plate 211 would begin ramping before the voltage applied to gate electrode 209 began changing to change the state of the LDFET. Likewise, in certain approaches control circuit 201 will begin ramping the voltage applied to the shield plate 211 before the LDFET is switched off and will complete ramping the voltage applied to shield plate 211 after the LDFET is switched off. In certain approaches, the ramping of the voltage on shield plate 211 will be slow enough that it will not ramp to its final level until the state of the LDFET has changed. In other approaches, delay buffer circuit 214 could delay the ramping of the voltage applied to the shield plate to assure that the LDFET had turned completely on before the shield plate bias reached its final value. In other approaches, the delay circuit may include hysteresis such that ramping in one direction was delayed as compared to the other direction. Such approaches would benefit from this hysteresis by not altering the conductivity of LDD region 205 unless the transistor was completely turned on while allowing the conductivity of the LDD region 205 to quickly return to an off-state. This type of approach would protect the LDFET in situations where the low impedance state of LDD region 205 was more problematic because breakdown damage can cause irreversible damage to the device as compared to the increase in power consumption and heat generation that would accompany a temporary increase in the on-state resistance of the LDFET.

Figure 3:
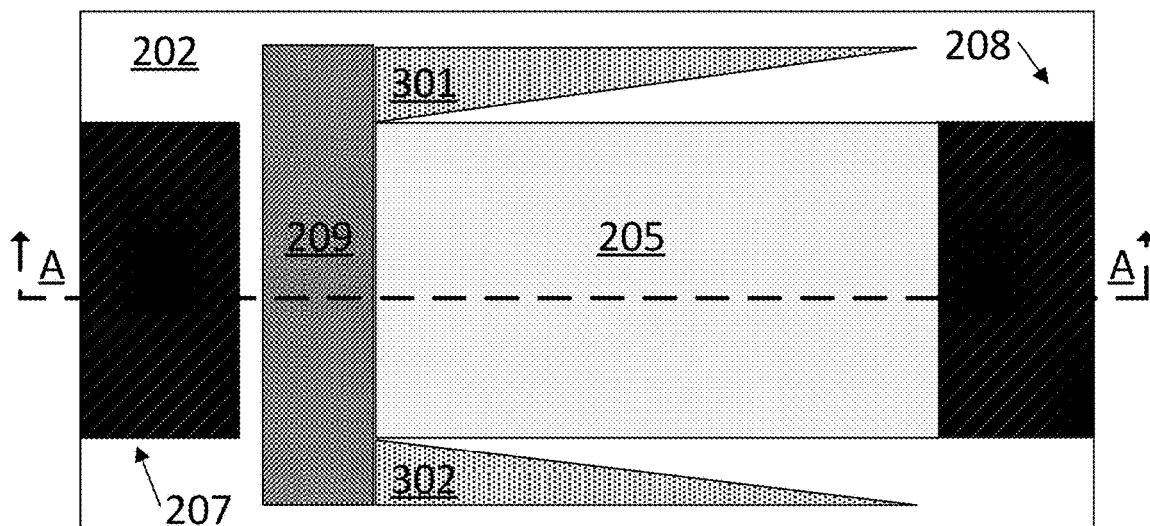
FIG. 3 illustrates a plan view of a lateral diffusion transistor that is in accordance with embodiments of the present invention.

FIG. 3 illustrates a plan view 300 of the same semiconductor structure illustrated by cross section 200 in FIG. 2. Reference line A is common to both figures. Plan view 300 does not include several layers of the semiconductor structure in order to make lower layers of the structure visible from a plan perspective. In particular, interlayer dielectric 212 and shield plate 211 are not present in plan view 300. The lowest visible layer is active region 202, which is represented by the rectangle forming the outline of the content of plan view 300. The highest visible layer comprises the conductive material used to form source contact 207 and drain contact 208. Plan view 300 also includes gate electrode 209 and LDD region 205. Plan view 300 also includes two tapered extensions of the shield plate that are outside the plane defined by reference line A such that they are absent from cross section 200. First tapered extension 301 is located on one side of LDD region 205 and its thickest portion is located on the gate side end of LDD region 205. Second tapered extension 302 is located on an opposite side of LDD region 205, but also has its thickest portion located on the gate side end of the LDD region.

The first and second tapered extensions 301 and 302 are located above the gate electrode and are biased by the externally applied variable voltage such that they are at the same potential as the shield plate. As LDFETs are often distributed in an array pattern on a substrate, the tapered extensions serve to shield the LDD region from adjacent LDFETs. The same decoupling of breakdown voltage and on-state resistance performance is provided by biasing these extensions in the manner described above with reference to the shield plate generally. Tapered extensions 301 and 302 can comprise metal formed above the plane in which the LDD region 205 is formed and can be separated from active region 202 by interlayer dielectric 212. Alternatively, tapered extensions 301 and 302 can be formed in the active region 202 and can comprise regions of heavily doped semiconductor material. In these approaches, the extensions 301, 302 can each be biased using a separate contact formed using the same approaches as discussed above with reference to drain contact 208 and source contact 207. However, the contact can also be formed from the shield plate 211 down to the tapered regions such that it would not be necessary to form an independent contact through interlayer dielectric 212 after the dielectric had been put in place. In other approaches, the first and second tapered extensions 301, 302 can be coupled to the source of their LDFET or can be connected to a separate externally applied voltage than the shield plate 211.

Figure 4:
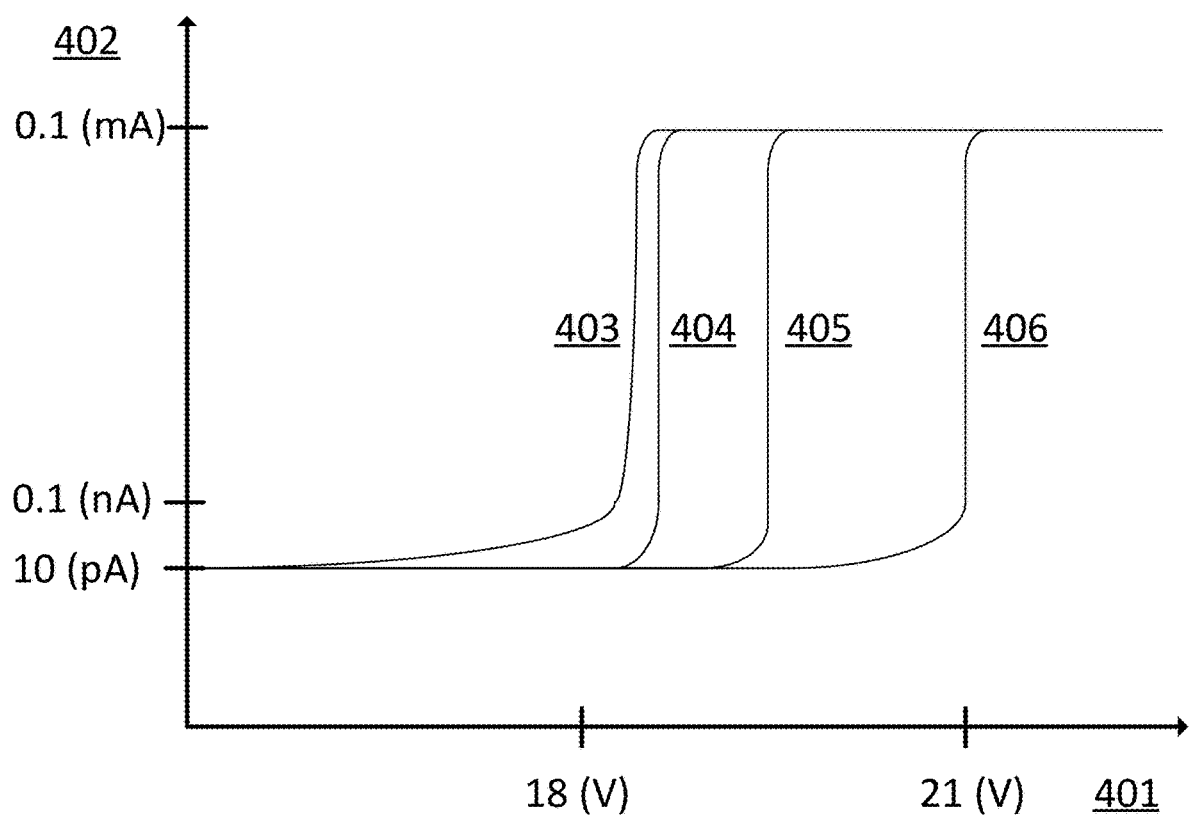
FIG. 4 illustrates a set of waveforms on a single plot charting the drain to source current of a lateral diffusion transistor logarithmically on the y-axis against the drain to source voltage across the lateral diffusion transistor on the x-axis for different voltages applied to the shield plate in accordance with embodiments of the present invention.

FIG. 4 illustrates several waveforms of drain to source voltage against drain to source current for an LDFET on plot 400 having a linear x-axis 401 in units of Volts and a logarithmic y-axis in units of Amperes 402. Waveforms 403, 404, 405, and 406 collectively show how a bias voltage on the shield plate affects the breakdown voltage of an LDFET. All four waveforms show a drain to source current of a negligible 10 pico-Amperes (pA) at a zero volt drain to source voltage. Since the gate bias is at zero volts in all four waveforms, this is to be expected and shows that each bias condition produces a functional off-state transistor. However, in each case, there is a point where the LDFET can no longer hold off a certain drain to source voltage and the LDFET breaks. This point is illustrated by a steep vertical portion of the waveform where the transistor is no longer functionally "off" as it is conducting current in the milli-Amperes (mA) range despite having a gate control voltage that should leave the transistor in an off-state.

Waveforms 403-406 are for an n-channel transistor and have bias voltages applied to the shield plate of 2V, 0V, −1V, −2V respectively. As illustrated, the effective breakdown voltage of each device increases as a more negative voltage is applied. Similar results could have been achieved by increasing the length or decreasing the dopant concentration of the LDD. However, as described above, the voltage applied to the shield plate is variable such that the effective ability of the LDFET to withstand high breakdown voltage can be applied temporarily and then removed when it again became necessary to have a device exhibiting a low on-state resistance.

Figure 5A:
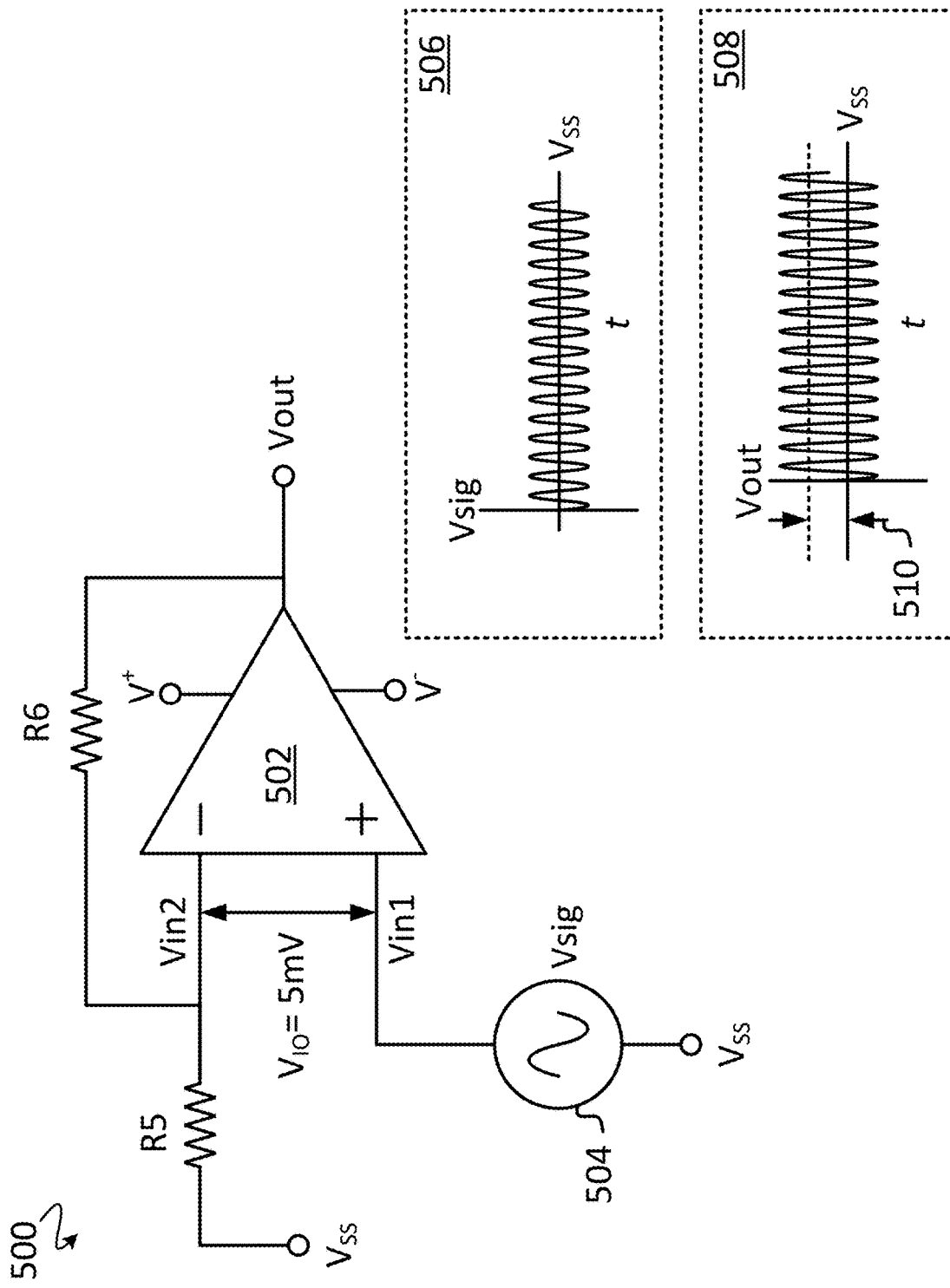
FIG. 5A illustrates a simplified schematic of a circuit and signals related to operation thereof using a prior art differential amplifier.

FIG. 5A illustrates a simplified schematic of a circuit 500 for amplifying a signal generated by a signal generator 504 using a prior art differential-pair amplifier ("differential amplifier") 502. The circuit 500 generally includes the conventional differential amplifier 502 having a non-inverting input ('+') to receive a first input voltage Vin1, an inverting input ('−') to receive a second input voltage Vin2, and an output to produce an output voltage Vout of the circuit 500. The circuit 500 also includes the signal generator 504, and resistors R5, R6. Signals related to operation of the circuit 500 include an input voltage Vsig generated by the signal generator 504 and received by the differential amplifier 502, a low-side bias voltage Vss of the circuit 500, and the output voltage Vout of the of the circuit 500. Signals related to operation of the circuit 500 also include a high-side bias voltage V+, and a low-side bias voltage V−. A plot 506 illustrates the input voltage Vsig over time t, and a plot 508 illustrates an example output Vout of the circuit 500 over time t. An input offset voltage $V_{IO}$ (e.g., 5 mV) represents a voltage that must be applied across the inverting and non-inverting terminals of the differential amplifier 502 to obtain zero volts at the output (i.e., Vout=0) when the non-inverting input to the differential amplifier 502 is grounded (i.e., Vsig=0). As shown in the plot 508, due to the input offset voltage $V_{IO}$ of the conventional differential amplifier 502 being greater than zero volts, an error voltage offset 510 is present at the output voltage Vout. For example, given a gain of 100× for the example circuit 500, an input offset voltage $V_{IO}$ of 5 mV will introduce 500 mV of error voltage offset 510 at the output voltage Vout.

Ideally, the input offset voltage $V_{IO}$ would equal zero volts. However, because of non-idealities of the differential amplifier 502, the input offset voltage $V_{IO}$ can range from, for example, −1 mV to +1 mV for some grades of differential amplifiers, or −10 mV to +10 mV for other grades of differential amplifiers. Such non-idealities include a mismatch of threshold voltages $V_{th}$ required by input transistors of the differential amplifier 502. Such idealities are conventionally addressed through manufacturing processes which may reduce, but not eliminate the input offset voltage $V_{IO}$. Additionally, in some instances, the input offset voltage $V_{IO}$ may drift over time or during changes in temperature of the differential amplifier 502.

FIG. 5B illustrates a simplified schematic of a circuit 520 for amplifying a signal generated by a signal generator 524 using a differential-pair amplifier ("differential amplifier") 522 having an adjustable input offset voltage $V_{IO}$, in accordance with some embodiments. The circuit 520 generally includes the differential amplifier 522, the signal generator 524, and the resistors R5, R6. The differential amplifier 522, having a non-inverting input ('+') to receive a first input voltage Vin1 and an inverting input ('−') to receive a second input voltage Vin2, is advantageously formed using transistors having respective adjustable threshold voltages $V_{th}$ that are adjusted using adaptively biased shield plates, as disclosed herein. Signals related to operation of the circuit 520 include an input voltage Vsig generated by the signal generator 524, an output voltage Vout of the circuit 520 over time t, and a low-side bias voltage Vss of the circuit 520. Also shown is a high-side bias voltage V+, and a low-side bias voltage V− of the differential amplifier 522. A plot 526 illustrates an example output Vsig of the signal generator 524 over time t, and a plot 528 illustrates an example output Vout of the circuit 520 over time t. By adjusting the respective threshold voltages $V_{th}$ of one or more of the transistors of the differential amplifier 522, an input offset voltage $V_{IO}$ of zero volts (i.e., $V_{IO}$=0V), or another desired input offset voltage, is achieved. As shown in the plot 528, because the input offset voltage $V_{IO}$ is zero volts, an error voltage offset 530 is also advantageously zero volts as well. Thus, the input voltage Vsig is amplified by the circuit 520 using the differential amplifier 522 with greater fidelity as compared to using the conventional differential amplifier 502.

FIGS. 6A, 6B, 7A, and 7B include example embodiments of a portion of the differential amplifier 522. Some circuit elements of the differential amplifier 522 have been omitted to simplify the description. The differential amplifier 522 is just one simplified example of a circuit that is improved by using one or more transistors having an adjustable threshold voltage $V_{th}$.

FIG. 6A illustrates a simplified schematic of a first example embodiment 622 of the differential amplifier 522 having an input offset voltage $V_{IO}$ that is adjusted using adaptively biased shield plates of transistors Q1, Q2 of the differential amplifier 622, in accordance with some embodiments. In some embodiments, the input offset voltage $V_{IO}$ is set to a desired input offset voltage of zero volts. In other embodiments, the input offset voltage $V_{IO}$ is set to a desired input offset voltage of almost zero volts. In still yet other embodiments, the input offset voltage $V_{IO}$ is set to a desired input offset voltage other than zero volts or other than almost zero volts, as chosen based on operating parameters of the differential amplifier 622. The differential amplifier 622 generally includes the transistor Q1 having a shield plate $Q1_{sh}$, the transistor Q2 having a shield plate $Q2_{sh}$, a first resistor R1, a second resistor R2, and a bias current source 603.

The transistors Q1, Q2 form a differential pair of the differential amplifier 622. A drain contact of the transistor Q1 is electrically connected to a first terminal of the resistor R1 and a drain contact of the transistor Q2 is electrically connected to a first terminal of the resistor R2. A second terminal of the resistor R1 is electrically connected to the second terminal of the resistor R2. A source contact of the transistor Q1 is electrically connected to a source contact of the transistor Q2. A gate electrode of the transistor Q1 is electrically coupled to a first input voltage terminal of the differential amplifier 622 (i.e., a non-inverting input terminal) to receive the first input voltage Vin1, and a gate electrode of the transistor Q2 is electrically coupled to a second input voltage terminal of the differential amplifier 622 (i.e., an inverting input terminal) to receive the second input voltage Vin2. An output voltage terminal of the differential amplifier is electrically coupled to either the drain contact of the transistor Q1 (Vout1) or the drain contact of the transistor Q2 (Vout2) to produce Vout of the circuit 520. Either or both of the resistors R1, R2 can be embodied by a fixed resistor, an adjustable resistor, and/or as a circuit that controls a flow of current from a high-side bias voltage $V^+$ through the transistors Q1, Q2.

Also shown is an optional control circuit 604A that generally includes a control module 606A, and digital-to-analog converters 608a-b or other means to generate multiple gate bias voltages Vbias1-2. In some embodiments, the control circuit 604A includes some or all of the elements of the control circuit 201, described above, and is configured to operate in the same or similar manner described with reference to the control circuit 201. Signals related to the operation of the differential amplifier 622 include the high-side bias voltage $V^+$, the low-side bias voltage $V^-$, the first input voltage Vin1, the second input voltage Vin2, a first output voltage Vout1, a second output voltage Vout2, a gate bias voltage Vbias1 of the transistor Q1, a gate bias voltage Vbias2 of the transistor Q2, and a bias current Ibias. Signals related to operation of the optional control circuit 604A include an optional external signal, or signals, $Ext_{sig}$ received by the control module 606A, a first gate bias control signal $Bias_{Ctl1}$, and a second gate bias control signal $Bias_{Ctl2}$. In some embodiments, the output voltage Vout of the circuit 520 of FIG. 5B is Vout1 and is referenced to the output voltage Vout2.

A threshold voltage $V_{th}$ of the transistor Q1 is a voltage level, applied between the gate electrode and the source contact of the transistor Q1, that is required to turn the transistor Q1 on such that the transistor Q1 is operating in a linear or saturation mode of operation. Similarly, a threshold voltage $V_{th}$ of the transistor Q2 is a voltage level, applied between the gate electrode and the source contact of the transistor Q2, that is required to turn the transistor Q2 on such that the transistor Q2 is operating in a linear or saturation mode of operation. As described above, because of a mismatch in threshold voltages $V_{th}$ of transistors used in conventional differential amplifiers, conventional differential amplifiers have an input offset voltage $V_{IO}$ that is greater than or less than zero volts. As disclosed herein, by advantageously adjusting the threshold voltage $V_{th}$ of the transistor Q1 and/or the threshold voltage $V_{th}$ of the transistor Q2 to respective desired threshold voltages, the input offset voltage $V_{IO}$ of the differential amplifier 622 can be advantageously reduced to zero volts, nearly zero volts, or to another desired non-zero voltage level. In some embodiments, the threshold voltage $V_{th}$ of the transistor Q1 and/or the threshold voltage $V_{th}$ of the transistor Q2 are adjusted such that the threshold voltage $V_{th}$ of the transistor Q1 is equal to the threshold voltage $V_{th}$ of the transistor Q2.

Similar to the LDFET device of the semiconductor cross section 200 shown and described with reference to FIG. 2, reproduced in inset 610, the shield plate $Q1_{sh}$ (e.g., 211) of the transistor Q1 is separated from an LDD region (e.g., 205), a gate electrode (e.g., 209), and a source contact (e.g., 207) of the transistor Q1 by an interlayer dielectric (e.g., 212). An externally applied fixed or variable voltage Vbias1 that is applied to the shield plate $Q1_{sh}$ of the transistor Q1 can be higher or lower than a voltage applied to the source contact of the transistor Q1. The bias voltage Vbias1 is operable to pull majority carriers in the LDD region (e.g., 205) of the transistor Q1 towards the shield plate $Q1_{sh}$ (e.g., 211) or push majority carriers in the LDD region (e.g., 205) of the transistor Q1 away from the shield plate $Q1_{sh}$ (e.g., 211), thereby adjusting the threshold voltage $V_{th}$ of the transistor Q1 to a desired threshold voltage.

Similarly, the shield plate $Q2_{sh}$ (e.g., 211) of the transistor Q2 is separated from an LDD region (e.g., 205), a gate electrode (e.g., 209), and a source contact (e.g., 207) of the transistor Q2 by an interlayer dielectric (e.g., 212). An externally applied fixed or variable voltage Vbias2 that is applied to the shield plate $Q2_{sh}$ of the transistor Q2 can be higher or lower than a voltage applied to the source contact of the transistor Q2. The bias voltage Vbias2 is operable to pull majority carriers in the LDD region (e.g., 205) of the transistor Q2 towards the shield plate $Q2_{sh}$ (e.g., 211) or push majority carriers in the LDD region (e.g., 205) of the transistor Q2 away from the shield plate $Q2_{sh}$ (e.g., 211), thereby adjusting the threshold voltage $V_{th}$ of the transistor Q2 to a desired threshold voltage. By adjusting either or both of the threshold voltage $V_{th}$ of the transistor Q1 and/or the threshold voltage $V_{th}$ of the transistor Q2, the input offset voltage $V_{IO}$ of the differential amplifier 622 is advantageously minimized, entirely eliminated (i.e., $V_{IO}$=0V or $V_{IO}$ is approximately 0V), or set to another desired level. For example, in some embodiments, a hysteresis of a differential pair that includes the transistors Q1, Q2 is advantageously dynamically controlled by adjusting (e.g., toggling) respective threshold voltages $V_{th}$ of the transistors Q1, Q2 between two or more voltage levels. In such embodiments, the hysteresis of the differential pair can be set to a fixed voltage range, or set to a voltage range that is periodically or continually updated. In some embodiments, a sensitivity of a threshold voltage $V_{th}$ adjustment of one or both of the transistors Q1, Q2 is adjusted in accordance to desired operating parameters by selection of a dimension and/or orientation of the shield plate 211 of that transistor. In some embodiments, one or both of the transistors Q1, Q2 are transistors other than LDFETs. In such embodiments, a respective shield plate of one or both of the transistors Q1, Q2 is operable to pull and/or push majority carriers from a region of the transistor Q1, Q2 other than an LDD region of that transistor.

In some embodiments, the gate bias voltage Vbias1 and/or the gate bias voltage Vbias2 are generated by the control circuit 604A in the same, or similar, manner as described with reference to the control circuit 201. In some embodiments, the control module 606A of the control circuit 604A includes a lookup table, a dynamic memory, a static memory, a one-time programmable memory, a processor, the control circuit 201, or other modules that are operable to configure the DACs 608a-b using gate bias control signals $Bias_{Ctl1}$, $Bias_{Ctl2}$ to generate the gate bias voltage Vbias1 and/or the gate bias voltage Vbias2 such that the input offset voltage $V_{IO}$ of the differential amplifier 622 is minimized, entirely eliminated, or set to a desired voltage level. In some embodiments, each transistor Q1, Q2 is associated with a separate control circuit that is the same or similar to the control circuit 604A. In some embodiments, the input offset voltage $V_{IO}$ of the differential amplifier 622 is calibrated out, or minimized, during a test operation of the differential amplifier 622 where one or both of Vbias1 and/or Vbias2 are determined and applied to one or both of the shield plates $Q1_{sh}$ and/or $Q2_{sh}$. In such embodiments, voltage levels of Vbias1 and/or Vbias2 are retrieved from the control module 606A and used during operation of the differential amplifier 622 post calibration.

In some embodiments, the gate bias control signal Bias$_{Ctl1}$ is, or includes, a digital indication of Vbias1. Similarly, in some embodiments, the gate bias control signal Bias$_{Ctl2}$ is, or includes, a digital indication of Vbias2. In some embodiments, values of the gate bias control signals Bias$_{Ctl1}$, Bias$_{Ctrl2}$ are stored at the control module 606A during a one-time manufacturing or calibration step of the differential amplifier 622 and retrieved during operation of the differential amplifier 622. In some embodiments, fixed values of the gate bias control signals Bias$_{Ctl1}$, Bias$_{Ctrl2}$ are received by the control module 606A using the signal Ext$_{sig}$. In other embodiments, values of the gate bias control signals Bias$_{Ctl1}$, Bias$_{Ctrl2}$ are generated repeatedly (e.g., periodically or continuously) by the control module 606A based on measurements made by the control module 606A during manufacturing, calibration, or operation of the differential amplifier 622. For example, in some embodiments, the control module 606A is operable to receive signals Ext$_{sig}$ related to the operation of the differential amplifier 622. In such embodiments, Ext$_{sig}$ is indicative of one or more of voltage levels of Vin1, Vin2, Vout1, Vout2, Vbias1, Vbias2 and/or currents through one or both of the transistors Q1, Q2. In such embodiments, the control module 606A is operational to determine (e.g., calculate) values of the gate bias control signals Bias$_{Ctl1}$, Bias$_{Ctl2}$, using the signals Ext$_{sig}$, to produce the gate bias voltage Vbias1 and/or the gate bias voltage Vbias2 such that the input offset voltage $V_{IO}$ of the differential amplifier 622 is minimized, entirely eliminated, or set to a desired level. For example, in such embodiments, respective threshold voltages $V_{th}$ of the transistors Q1, Q2 may be adjusted periodically or continuously to advantageously correct for age or temperature-based deviations in the input offset voltage $V_{IO}$ of the differential amplifier 622.

Figure 6B:
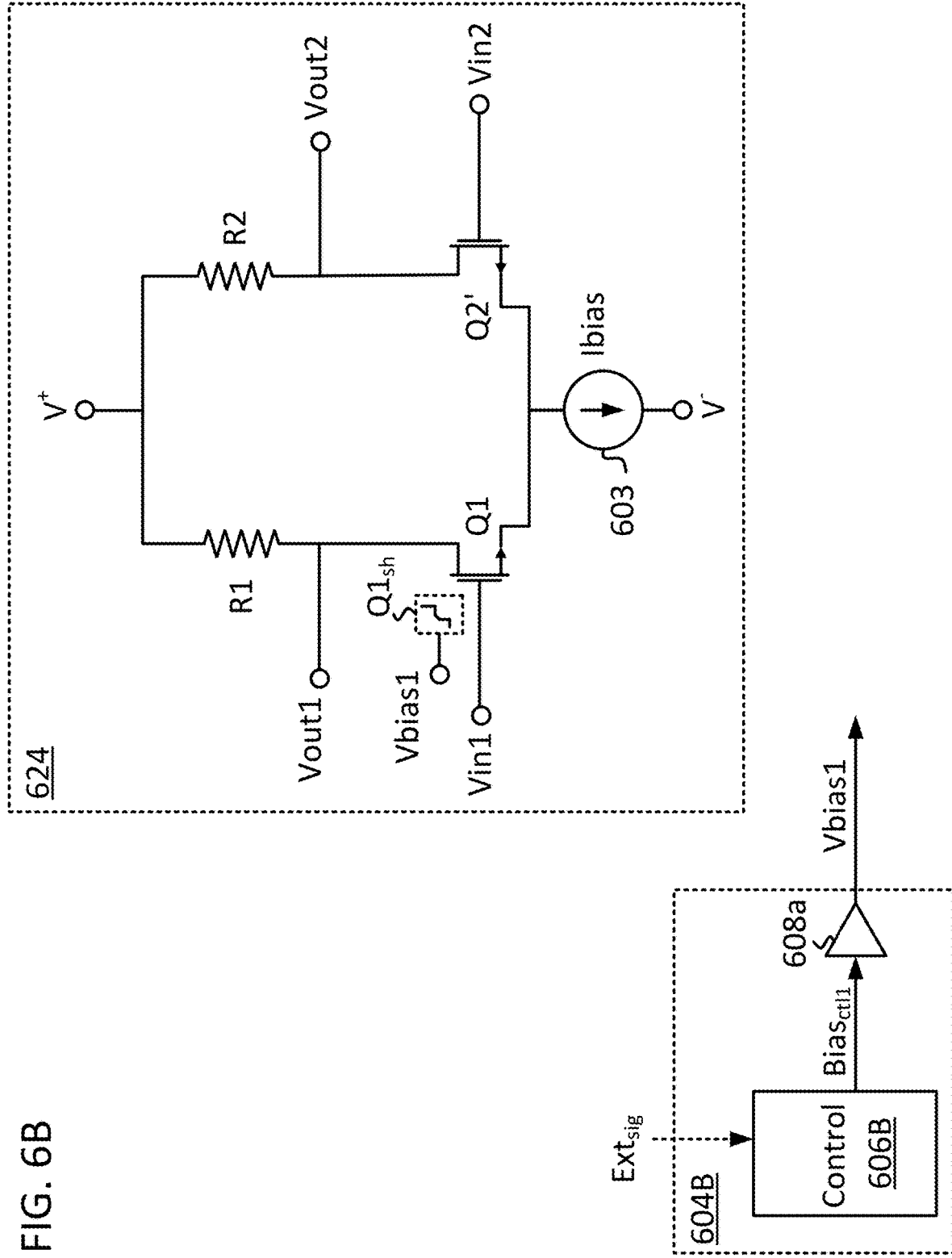
FIG. 6B illustrates a simplified schematic of a second differential amplifier having an adjustable input offset voltage $V_{IO}$ using an adaptively biased shield plate, in accordance with some embodiments.

FIG. 6B illustrates a simplified schematic of a second example embodiment 624 of the differential amplifier 522 having an adjustable input offset voltage $V_{IO}$ using a single adaptively biased shield plate, in accordance with some embodiments. In some embodiments, the input offset voltage $V_{IO}$ is set to a desired input offset voltage $V_{IO}$ of zero volts. In other embodiments, the input offset voltage $V_{IO}$ is set to a desired input offset voltage of almost zero volts. In still yet other embodiments, the input offset voltage $V_{IO}$ is set to a desired input offset voltage other than zero volts or other than almost zero volts. The differential amplifier 624 generally includes a transistor Q1 having a shield plate $Q1_{sh}$, a transistor Q2' having a shield plate (not shown) that is not configured to be adaptively biased or that is set a fixed bias level, the first resistor R1, the second resistor R2, and the bias current source 603.

The transistors Q1, Q2' form a differential pair of the differential amplifier 624. A drain contact of the transistor Q1 is electrically connected to a first terminal of the resistor R1 and a drain contact of the transistor Q2' is electrically connected to a first terminal of the resistor R2. A second terminal of the resistor R1 is electrically connected to the second terminal of the resistor R2. A source contact of the transistor Q1 is electrically connected to a source contact of the transistor Q2'. A gate electrode of the transistor Q1 is electrically coupled to a first input voltage terminal of the differential amplifier 624 (i.e., a non-inverting input terminal) to receive a first input voltage Vin1, and a gate electrode of the transistor Q2' is electrically coupled to a second input voltage terminal of the differential amplifier 624 (i.e., an inverting input terminal) to receive a second input voltage Vin2. An output voltage terminal of the differential amplifier 624 is electrically coupled to either the drain contact of the transistor Q1 (Vout1) or the drain contact of the transistor Q2' (Vout2) to produce Vout. Either or both of the resistors R1, R2 can be embodied by a fixed resistor, an adjustable resistor, and/or as a circuit that controls a flow of current from a high-side bias voltage $V^+$ through the transistors Q1, Q2'.

Also shown is an optional control circuit 604B that generally includes a control module 606B and the digital-to-analog converter 608a. In some embodiments, the control circuit 604B includes some or all of the elements of the control circuit 604A and/or the control circuit 201, described above, and is operable to operate in the same or similar manner described with reference to the control circuit 604A and/or the control circuit 201. Signals related to the operation of the differential amplifier 624 include the high-side bias voltage $V^+$, the low-side bias voltage $V^-$, the first input voltage Vin1, the second input voltage Vin2, the first output voltage Vout1, the second output voltage Vout2, the gate bias voltage Vbias1 of the transistor Q1, and the bias current Ibias. Signals related to the optional control circuit 604B include the optional external signal or signals Ext$_{sig}$ received by the control module 606B, and the first gate bias control signal Bias$_{Ctl1}$. In some embodiments, the output voltage Vout of the circuit 520 of FIG. 5B is Vout1 and is referenced to the output voltage Vout2.

Operation of the differential amplifier 624 is similar to that described with reference to the differential amplifier 622, and operation of the control circuit 604B is similar to that described with reference to the control circuit 604A. A threshold voltage $V_{th}$ of the transistor Q1 is a voltage level, applied between a gate electrode and the source contact of the transistor Q1, that is required to turn the transistor Q1 on such that the transistor Q1 is operating in a linear or saturation mode of operation. A threshold voltage $V_{th}$ of the transistor Q2' is a voltage level, applied between a gate electrode and the source contact of the transistor Q2', that is required to turn the transistor Q2' on such that the transistor Q2' is operating in a linear or saturation mode of operation. However, the threshold voltage $V_{th}$ of the transistor Q2' is fixed, and thus only the threshold voltage $V_{th}$ of the transistor Q1 is adjusted, using the gate bias voltage Vbias1, to a desired threshold voltage $V_{th}$ such that the input offset voltage $V_{IO}$ of the differential amplifier 624 is advantageously reduced to zero volts, nearly zero volts, or to another desired non-zero voltage level. In some embodiments, the threshold voltage $V_{th}$ of the transistor Q1 is adjusted such that the threshold voltage $V_{th}$ of the transistor Q1 is equal to the threshold voltage $V_{th}$ of the transistor Q2'.

Figure 7A:
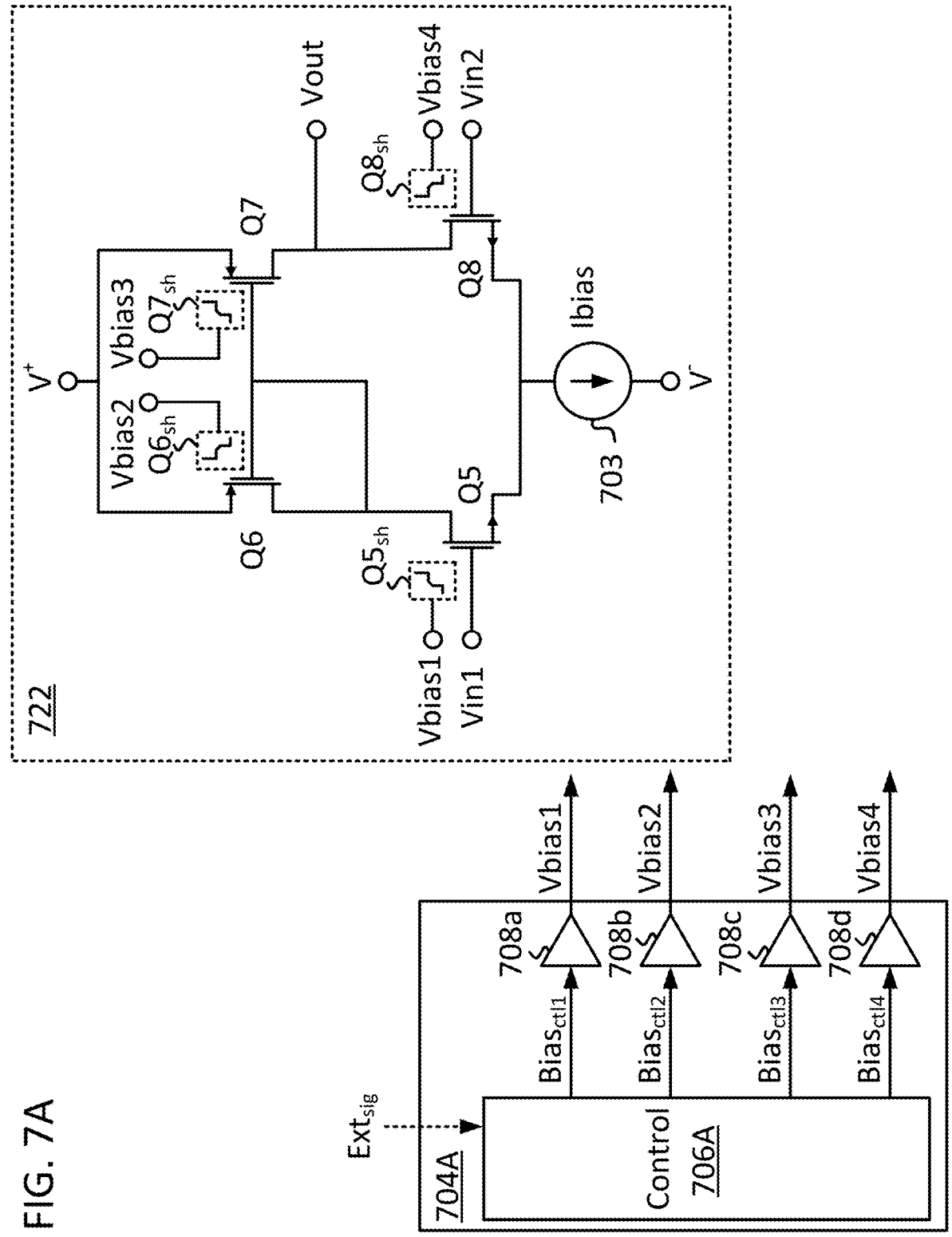
FIG. 7A illustrates a simplified schematic of a third differential amplifier having an adjustable input offset voltage $V_{IO}$ using adaptively biased shield plates, in accordance with some embodiments.

FIG. 7A illustrates a simplified schematic of a third example embodiment 722 of the differential amplifier 522 having an adjustable input offset voltage $V_{IO}$ using adaptively biased shield plates, in accordance with some embodiments. In some embodiments, the input offset voltage $V_{IO}$ is set to a desired input offset voltage of zero volts. In other embodiments, the input offset voltage $V_{IO}$ is set to a desired input offset voltage of almost zero volts. In still yet other embodiments, the input offset voltage $V_{IO}$ is set to a desired input offset voltage other than zero volts or other than almost zero volts. The differential amplifier 722 generally includes a transistor Q5 having a shield plate $QS_{sh}$, a transistor Q6 having a shield plate $Q6_{sh}$, a transistor Q7 having a shield plate $Q7_{sh}$, a transistor Q8 having a shield plate $Q8_{sh}$, and a bias current source 703.

The transistors Q6, Q7 form a current mirror portion of the differential amplifier 722 and the transistors Q5, Q8 form a differential pair of the differential amplifier 722. A drain contact of the transistor Q5 is electrically connected to a drain contact of the transistor Q6. A drain contact of the transistor Q8 is electrically connected to a drain contact of the transistor Q7. A gate electrode of the transistor Q6 is electrically connected to a gate electrode of the transistor Q7 and to the drain contact of the transistor Q5. A source contact of the transistor Q5 is electrically connected to a source contact of the transistor Q8, and a source contact of the transistor Q6 is electrically connected to a source contact of the transistor Q7. A gate electrode of the transistor Q5 is electrically coupled to a first input voltage terminal of the differential amplifier 722 (i.e., a non-inverting input terminal) to receive a first input voltage Vin1, and a gate electrode of the transistor Q8 is electrically coupled to a second input voltage terminal of the differential amplifier 722 (i.e., an inverting input terminal) to receive a second input voltage Vin2. An output voltage terminal of the differential amplifier 722 is electrically coupled to the drain contact of the transistor Q8 to produce Vout (e.g., of the circuit 520).

Also shown is an optional control circuit 704A that generally includes a control module 706A and digital-to-analog converters 708a-d or other means to generate multiple gate bias voltages Vbias1-4. In some embodiments, the control circuit 704A includes some or all of the elements of the control circuit 201, and/or the control circuit 604A, described above, and is operable to operate in the same or similar manner described with reference to the control circuit 201 and/or the control circuit 604A. Signals related to the operation of the differential amplifier 722 include a high-side bias voltage $V^+$, a low-side bias voltage $V^-$, the first input voltage Vin1, the second input voltage Vin2, the output voltage Vout, a gate bias voltage Vbias1 of the transistor Q5, a gate bias voltage Vbias2 of the transistor Q6, a gate bias voltage Vbias3 of the transistor Q7, a gate bias voltage Vbias4 of the transistor Q8, and a bias current Ibias. Signals related to the optional control circuit 704A include an optional external signal or signals $Ext_{sig}$ received by the control module 706A, a first gate bias control signal $Bias_{Ctl1}$, a second gate bias control signal $Bias_{Ctl2}$, a third gate bias control signal $Bias_{Ctl3}$, and a fourth gate bias control signal $Bias_{Ctl4}$.

Operation of the differential amplifier 722 is similar to that described with reference to the differential amplifiers 622, 624, and operation of the control circuit 704A is similar to that described with reference to the control circuits 604A, 604B. In the embodiment shown, threshold voltages $V_{th}$ of the transistor Q5, Q6, Q7, Q8 are adjusted, using the gate bias voltages Vbias1, Vbias2, Vbias3, Vbias4, to respective desired threshold voltages $V_{th}$ such that the input offset voltage $V_{IO}$ of the differential amplifier 722 is advantageously reduced to zero volts, almost zero volts, or to another desired non-zero voltage level. In some embodiments, the transistors Q6, Q7 do not have adjustable threshold levels, or have fixed adjustable threshold levels. In some embodiments, the threshold voltage $V_{th}$ of the transistor Q5 and/or the threshold voltage $V_{th}$ of the transistor Q8 are adjusted such that the threshold voltage $V_{th}$ of the transistor Q5 is equal to the threshold voltage $V_{th}$ of the transistor Q8. Similarly, in some embodiments, the threshold voltage $V_{th}$ of the transistor Q6 and/or the threshold voltage $V_{th}$ of the transistor Q7 are adjusted such that the threshold voltage $V_{th}$ of the transistor Q6 is equal to the threshold voltage $V_{th}$ of the transistor Q7.

Figure 7B:
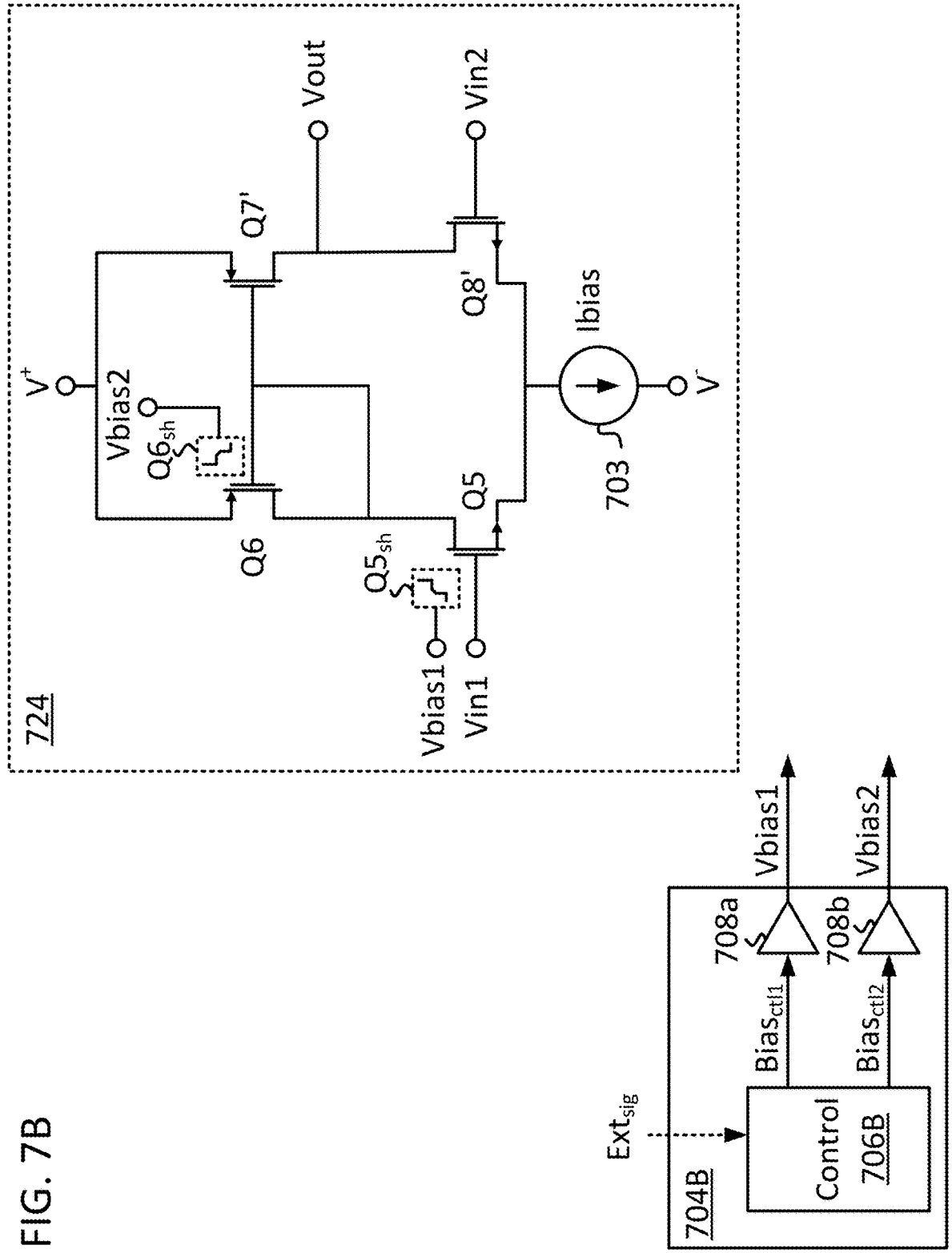
FIG. 7B illustrates a simplified schematic of a fourth differential amplifier having an adjustable input offset voltage $V_{IO}$ using adaptively biased shield plates, in accordance with some embodiments.

FIG. 7B illustrates a simplified schematic of a fourth example embodiment 724 of the differential amplifier 522 having an adjustable input offset voltage $V_{IO}$ using adaptively biased shield plates, in accordance with some embodiments. In some embodiments, the input offset voltage $V_{IO}$ is set to a desired input offset voltage of zero volts. In other embodiments, the input offset voltage $V_{IO}$ is set to a desired input offset voltage of almost zero volts. In still yet other embodiments, the input offset voltage $V_{IO}$ is set to a desired input offset voltage other than zero volts or other than almost zero volts. The differential amplifier 724 generally includes a transistor Q5 having a shield plate $QS_{sh}$, a transistor Q6 having a shield plate $Q6_{sh}$, a transistor Q7' having a shield plate (not shown) that is not configured to be adaptively biased or is set a fixed bias level, a transistor Q8' having a shield plate (not shown) that is not configured to be adaptively biased or is set a fixed bias level, and the bias current source 703.

The transistors Q6, Q7' form a current mirror portion of the differential amplifier 724 and the transistors Q5, Q8' form a differential pair of the differential amplifier 724. A drain contact of the transistor Q5 is electrically connected to a drain contact of the transistor Q6. A drain contact of the transistor Q8' is electrically connected to a drain contact of the transistor Q7'. A gate electrode of the transistor Q6 is electrically connected to a gate electrode of the transistor Q7' and to the drain contact of the transistor Q5. A source contact of the transistor Q5 is electrically connected to a source contact of the transistor Q8', and a source contact of the transistor Q6 is electrically connected to a source contact of the transistor Q7'. A gate electrode of the transistor Q5 is electrically coupled to a first input voltage terminal of the differential amplifier 724 (i.e., a non-inverting input terminal) to receive a first input voltage Vin1, and a gate electrode of the transistor Q8' is electrically coupled to a second input voltage terminal of the differential amplifier 724 (i.e., an inverting input terminal) to receive a second input voltage Vin2. An output voltage terminal of the differential amplifier 724 is electrically coupled to the drain contact of the transistor Q8' to produce Vout (e.g., of the circuit 520).

Also shown is an optional control circuit 704B that generally includes a control module 706B and the digital-to-analog converters 708a-b. In some embodiments, the control circuit 704B includes some or all of the elements of the control circuit 704A and/or the control circuit 201, described above, and is operable to operate in the same or similar manner described with reference to the control circuit 704A and/or the control circuit 201. Signals related to the operation of the differential amplifier 724 include the high-side bias voltage $V^+$, the low-side bias voltage $V^-$, the first input voltage Vin1, the second input voltage Vin2, the output voltage Vout, the gate bias voltage Vbias1 of the transistor Q5, the gate bias voltage Vbias2 of the transistor Q6, and the bias current Ibias. Signals related to the optional control circuit 704B include the optional external signal or signals $Ext_{sig}$ received by the control module 706B, the first gate bias control signal $Bias_{Ctl1}$, and the second gate bias control signal $Bias_{Ctl2}$.

Operation of the differential amplifier 724 is similar to that described with reference to the differential amplifier 722, and operation of the control circuit 704B is similar to that described with reference to the control circuit 704A. In the embodiment shown, threshold voltages $V_{th}$ of the transistor Q5, Q6 are adjusted using the gate bias voltages Vbias1, Vbias2. However, threshold voltages $V_{th}$ of the transistors Q7', Q8' are fixed, and thus only the threshold voltages $V_{th}$ of the transistors Q5, Q6 are adjusted to respective desired threshold voltages using the gate bias voltages Vbias1, Vbias2 such that the input offset voltage $V_{IO}$ of the differential amplifier 724 is advantageously reduced to zero volts, almost zero volts, or to another desired non-zero voltage level. In some embodiments, the threshold voltage $V_{th}$ of the transistor Q5 is adjusted such that the threshold voltage $V_{th}$ of the transistor Q5 is equal to the threshold voltage $V_{th}$ of the transistor Q8'. Similarly, in some embodiments, the threshold voltage $V_{th}$ of the transistor Q6 is adjusted such that the threshold voltage $V_{th}$ of the transistor Q6 is equal to the threshold voltage $V_{th}$ of the transistor Q7'.

Other variations for implementing the differential amplifier 522 having an adjustable input offset voltage $V_{IO}$ using one or more adaptively biased shield plates are possible, for example, by combining aspects of the example embodiments shown in FIG. 6A, FIG. 6B, FIG. 7A, and/or FIG. 7B. In some embodiments, the number of transistors of a circuit configured to have an adjustable threshold voltage $V_{th}$ may be selected based on a desired manufacturing cost of the circuit, desired design complexity of the circuit, a desired accuracy of the circuit, a desired configurability of the circuit, or based upon other design constraints or considerations. In some embodiments, a differential pair (e.g., Q1, Q2 or Q1, Q2') having an adjustable input offset voltage $V_{IO}$ as disclosed herein is, or is part of, a circuit other than a differential amplifier.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

The invention claimed is:

1. An apparatus, comprising:
   a first lateral diffusion field effect transistor (LDFET) having a first threshold voltage and comprising a first gate electrode, a first drain contact, a first source contact, and a first electrically conductive shield plate separated from the first gate electrode and the first source contact by a first interlayer dielectric; and
   a control circuit electrically coupled to the first electrically conductive shield plate and configured to apply to the first electrically conductive shield plate a first gate bias voltage being of a first voltage level to set the first threshold voltage of the first LDFET to a first desired threshold voltage, the first gate bias voltage being temporally offset from a control signal applied to the first gate electrode.

2. The apparatus of claim 1, further comprising:
   a second LDFET comprising a second threshold voltage and comprising a second gate electrode, a second drain contact, and a second source contact, the second source contact being electrically connected to the first source contact of the first LDFET;
   wherein the first desired threshold voltage is equal to the second threshold voltage of the second LDFET.

3. The apparatus of claim 2, wherein:
   the second LDFET comprises a second electrically conductive shield plate separated from the second gate electrode and the second source contact by a second interlayer dielectric, the second electrically conductive shield plate being electrically coupled to the control circuit; and
   the control circuit is further configured to apply to the second electrically conductive shield plate a second gate bias voltage being of a second voltage level to set the second threshold voltage of the second LDFET to a second desired threshold voltage.

4. The apparatus of claim 3, wherein:
   the second desired threshold voltage of the second LDFET is equal to the first desired threshold voltage of the first LDFET.

5. The apparatus of claim 2, further comprising:
   a first resistor having a first terminal electrically connected to the first drain contact of the first LDFET; and
   a second resistor having a first terminal electrically connected to the second drain contact of the second LDFET and a second terminal electrically connected to a second terminal of the first resistor.

6. The apparatus of claim 1, wherein:
   the control circuit comprises a digital to analog converter (DAC) configured to generate the first gate bias voltage.

7. The apparatus of claim 1, wherein:
   the first electrically conductive shield plate of the first LDFET comprises first and second tapered extensions located on opposite sides of a drain region of the first LDFET, and the first and second tapered extensions are thickest at an end of the drain region nearest the first gate electrode.

8. The apparatus of claim 7, wherein:
   the first and second tapered extensions are located above the first gate electrode, are biased by the first gate bias voltage at the same voltage level as the first electrically conductive shield plate, and shield the first LDFET from an adjacent LDFET.

* * * * *